United States Patent
Oms (10) Patent No.: US 10,938,201 B2
(45) Date of Patent: Mar. 2, 2021

(54) ELECTRICAL LINK COMPRISING AN ELECTRICAL PROTECTION DEVICE—CURRENT BIAS

(71) Applicant: AIRBUS OPERATIONS (S.A.S.), Toulouse (FR)

(72) Inventor: Patrick Oms, Colomiers (FR)

(73) Assignee: AIRBUS OPERATIONS (S.A.S.), Toulouse (FR)

( * ) Notice: Subject to any disclaimer, the term of this patent is extended or adjusted under 35 U.S.C. 154(b) by 375 days.

(21) Appl. No.: 15/967,953

(22) Filed: May 1, 2018

(65) Prior Publication Data
US 2018/0323602 A1  Nov. 8, 2018

(30) Foreign Application Priority Data
May 3, 2017  (FR) .................................... 1753860

(51) Int. Cl.
| | |
|---|---|
| H02H 3/00 | (2006.01) |
| H02H 3/20 | (2006.01) |
| H03K 5/24 | (2006.01) |
| B64D 45/00 | (2006.01) |
| H02H 1/00 | (2006.01) |
| H02H 3/17 | (2006.01) |
| G01R 31/50 | (2020.01) |

(Continued)

(52) U.S. Cl.
CPC ............. *H02H 3/202* (2013.01); *B64D 45/00* (2013.01); *G01R 31/50* (2020.01); *H02H 1/003* (2013.01); *H02H 1/0007* (2013.01); *H02H 3/17* (2013.01); *H03K 5/24* (2013.01); *B64D 45/02* (2013.01); *B64D 2221/00* (2013.01); *H02H 7/228* (2013.01)

(58) Field of Classification Search
CPC ........ H02H 3/202; H02H 1/0007; H03K 5/24; B64D 45/00
USPC .............................................. 361/86
See application file for complete search history.

(56) References Cited

U.S. PATENT DOCUMENTS

| | | | |
|---|---|---|---|
| 5,909,348 A | * | 6/1999 | Zydek .................. G01R 31/50 361/79 |
| 6,084,207 A | | 7/2000 | Jones |

(Continued)

FOREIGN PATENT DOCUMENTS

| | | |
|---|---|---|
| DE | 10 2012 019996 | 4/2014 |
| JP | 2002-247753 | 8/2002 |

OTHER PUBLICATIONS

Search Report for FR1753860, dated Mar. 16, 2018, 1 page.

*Primary Examiner* — Jared Fureman
*Assistant Examiner* — Lucy M Thomas
(74) *Attorney, Agent, or Firm* — Nixon & Vanderhye P.C.

(57) ABSTRACT

An electrical link (8) between a DC high-voltage power source (2) and a user apparatus (5) including: an electrical conductor (4) surrounded by an insulating cover (4a), and an electrical protection device (3) that includes a conductive sleeve (7) arranged around the insulating cover (4a), a current generator (10) connected to a current injection point (30) of the conductive sleeve (7), a circuit breaker (9) arranged on the conductor and configured to cut off a current transiting through the conductor (4), and a detection module (11) connected to a current tap-off point (31) of the conductive sleeve (7) and to the circuit breaker (9) and configured to detect a current leak out of the conductor (4) and command the circuit breaker (9).

12 Claims, 6 Drawing Sheets

(51) Int. Cl.
    *B64D 45/02*     (2006.01)
    *H02H 7/22*     (2006.01)

(56) References Cited

U.S. PATENT DOCUMENTS

2003/0002235 A1    1/2003    Takeda
2005/0128661 A1    6/2005    Maeckel et al.

\* cited by examiner

ELECTRICAL LINK COMPRISING AN ELECTRICAL PROTECTION DEVICE—CURRENT BIAS

RELATED APPLICATION

This application claims priority to French Patent Application 1753860 filed May 3, 2017, the entirety of which is incorporated by reference.

TECHNICAL FIELD

The present invention relates to an electrical link for the transmission of a DC high voltage to a user apparatus, wherein the link includes an electrical protection device for supplying electric power in a secure manner. The invention also relates to a method to securely supply electric power to a user apparatus in a vehicle via an electrical link.

BACKGROUND OF THE INVENTION

An electrical installation on an aircraft comprises an electric power source linked to a user apparatus to be supplied with electric power via an electrical link formed of an electrical conductor covered with an insulating cover. The electrical link comprises a circuit breaker device for monitoring the parameters of the electrical signal transiting through the link between the power source and the user apparatus in order to interrupt an overload current or a short-circuit current in the conductor.

Electric power consumed on aircraft is constantly increasing with new aircraft designs and with increasing numbers of electrically powered components on an aircraft. This trend of increasing electrical power inevitably leads to an increase in the voltage levels of the electric power supply systems on aircraft, which were traditionally 115 volts AC (AC for alternating current) and 28 volts DC (DC for direct current).

Voltages of the order of +/−270 volts DC or +/−540 volts DC are nowadays contemplated. These high voltage levels give rise to new problems on aircraft. For example, series or parallel electric arcs might occur due to a current leak from the electrical link. A parallel arc between an electrical conductor supplying power to an apparatus and the conductive structure of an aircraft, or between two adjacent electrical conductors could damage the user apparatus.

Prior art circuit breaker devices are not optimized for securing the transmission of power via the electrical links of installations using high voltages. Specifically, at the voltages being contemplated for aircraft, prior art circuit breakers would require mandatory large safety distances between a strand containing power supply cables and the airframe of the aircraft, or between a strand containing power supply cables and another strand containing data transmission cables. These safety distances prevent a possible electric arc in the strand containing power supply cables from damaging the conductive structure of the aircraft, or the strand containing data transmission cables, through a thermal effect. These safety distances create requires for large spatial constraints in an aircraft.

SUMMARY OF THE INVENTION

There is a need for a device to provide electrical protection of an electrical link to secure the supply of high-voltage electric power to a user apparatus in a vehicle and that completely or partly overcomes the drawback of the prior art mentioned above. To this end, the invention relates to an electrical link designed to link a DC high-voltage power source to a user apparatus, the electrical link comprising an electrical conductor surrounded by an insulating cover, the electrical link comprising an electrical protection device comprising:

a conductive sleeve arranged around the insulating cover,
a current generator connected to a current injection point of the conductive sleeve,
a circuit breaker arranged on the conductor and configured to cut off a current transiting through the conductor, and
a detection module connected to a current tap-off point of the conductive sleeve and to the circuit breaker and configured to detect a current leak out of the conductor and command the circuit breaker.

The invention also relates to a method to provide a safe and secure supply of electric power to a user apparatus in a vehicle via an electrical link connected between the user apparatus and a power source supplying a DC voltage, the vehicle including a conductive structure forming a ground, the electrical link comprising:

an electrical conductor surrounded by an insulating cover;
an electrical protection device comprising:
a. a conductive sleeve arranged around the insulating cover;
b. a current generator connected to a current injection point of the conductive sleeve;
c. a circuit breaker arranged on the conductor and configured to cut off a current transiting through the conductor; and
d. a detection module comprising a shunt having a first terminal connected to a current tap-off point of the conductive sleeve and a second terminal connected to ground, a comparator whose first input is connected to the first terminal of the shunt via an electrical link, termed detection line, and whose second input is connected to a DC voltage generator supplying what is termed a reference voltage; and a microcontroller connected between an output of the comparator and the circuit breaker, The method may comprise the following successive steps:
injection, by the current generator, of a DC current at the current injection point;
measurement of a magnitude of a current, via the shunt, tapped off at the current tap-off point;
comparison, by the comparator, of a voltage on the detection line with the reference voltage, the voltage on the detection line being proportional to the magnitude of the current measured via the shunt;
monitoring, by the microcontroller, of the state of the output signal of the comparator, said state being either a first state indicative of a current leak out of the conductor or a second state if not; and
activation of the circuit breaker by the microcontroller if the output signal of the comparator is in the first state.

SUMMARY OF THE DRAWINGS

The abovementioned features of the invention, as well as others, will become more clearly apparent upon reading the following description of an exemplary embodiment, said description being given with reference to the appended drawings, in which.

DETAILED DESCRIPTION OF THE INVENTION

Figure 1:
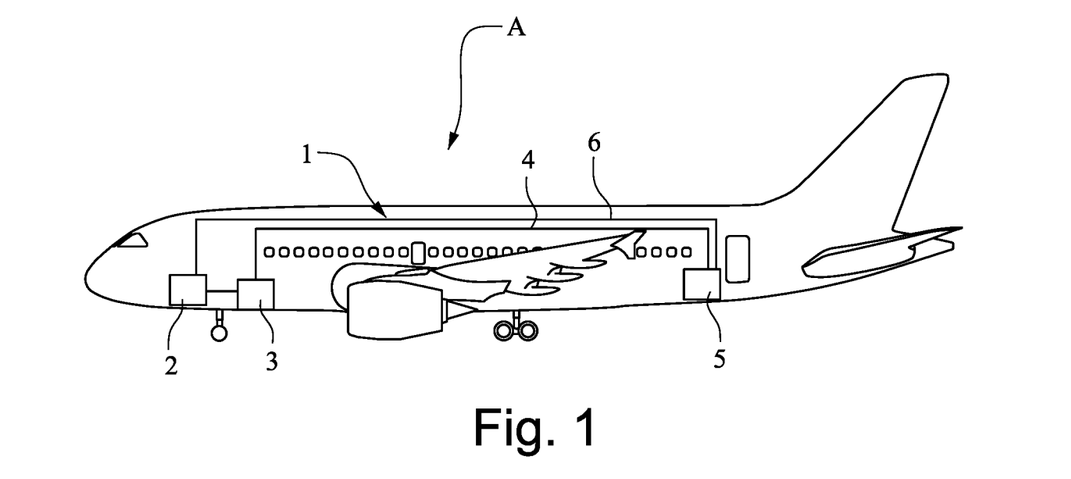
FIG. 1 shows an aircraft including an electrical installation having a power source connected to a user apparatus via an electrical link and a current return line, and a device for the electrical protection of the electrical link according to one embodiment of the invention.

With reference to FIG. 1, an aircraft A includes an electrical installation 1 having a high-voltage power source 2 connected to a user apparatus 5 via an electrical link 8 comprising an electrical protection device 3 associated with the electrical link 8.

The power source 2 is furthermore linked to the user apparatus 5 by a current return line 6.

The high-voltage power source 2 supplies a DC voltage HV of the order of +/−270 volts DC, +/−540 volts DC or other voltage level.

Figure 4:
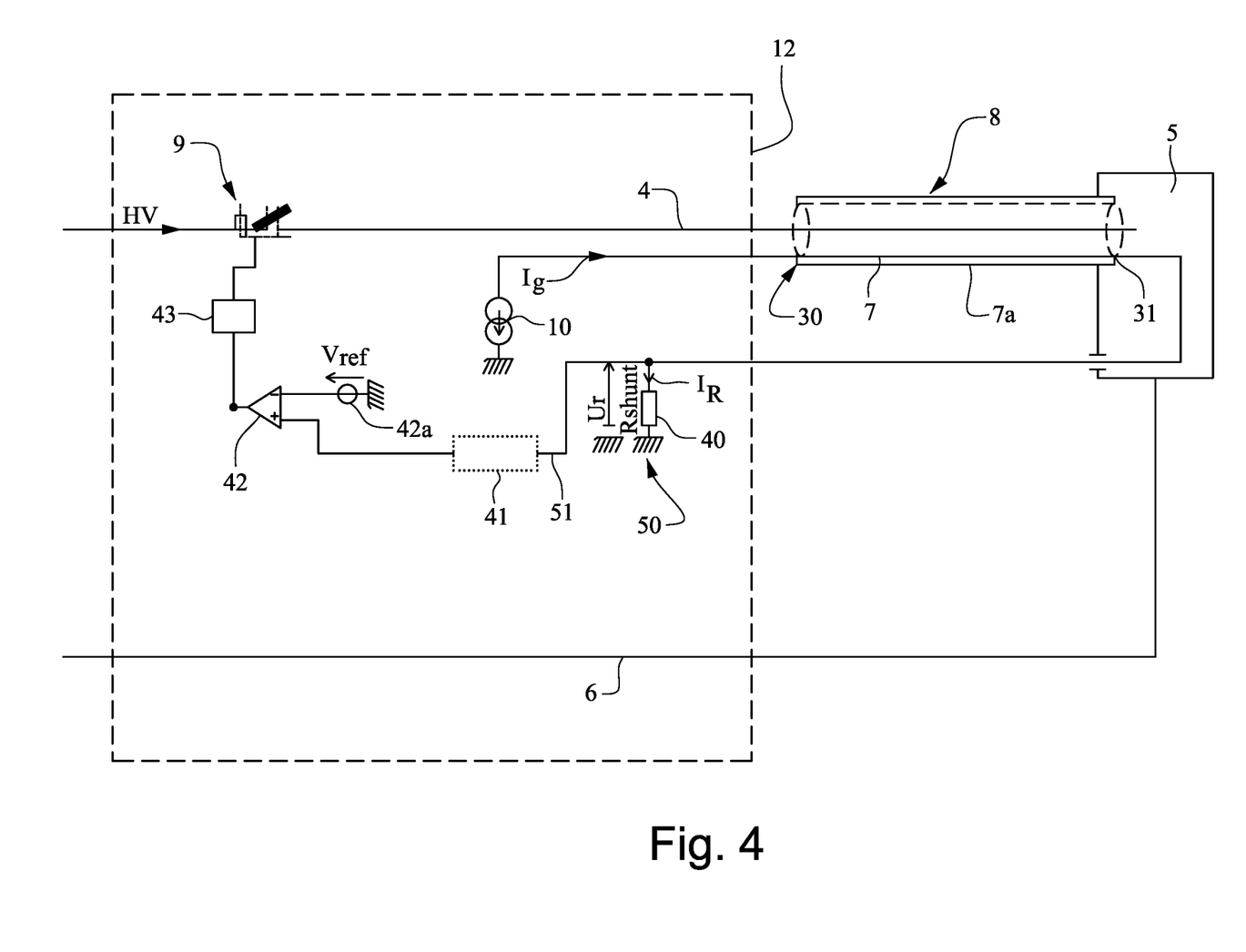
FIG. 4 shows a circuit diagram of the electrical installation shown in FIG. 2.

The aircraft A furthermore comprises a conductive structure (not shown) that is formed by a metal or other conductive element of the aircraft and is at a reference potential to form the ground 50 (visible in FIG. 4).

Figure 2:
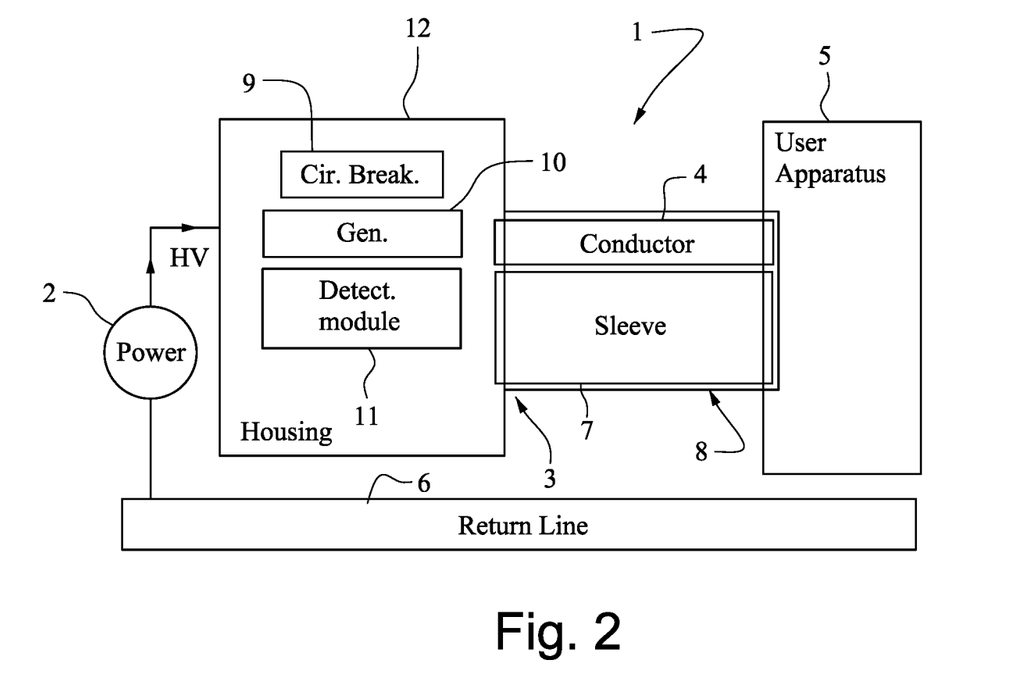
FIG. 2 shows a block diagram of the electrical installation shown in FIG. 1, and a depiction of the device for the electrical protection of the electrical link according to one embodiment of the invention.
Figure 3:
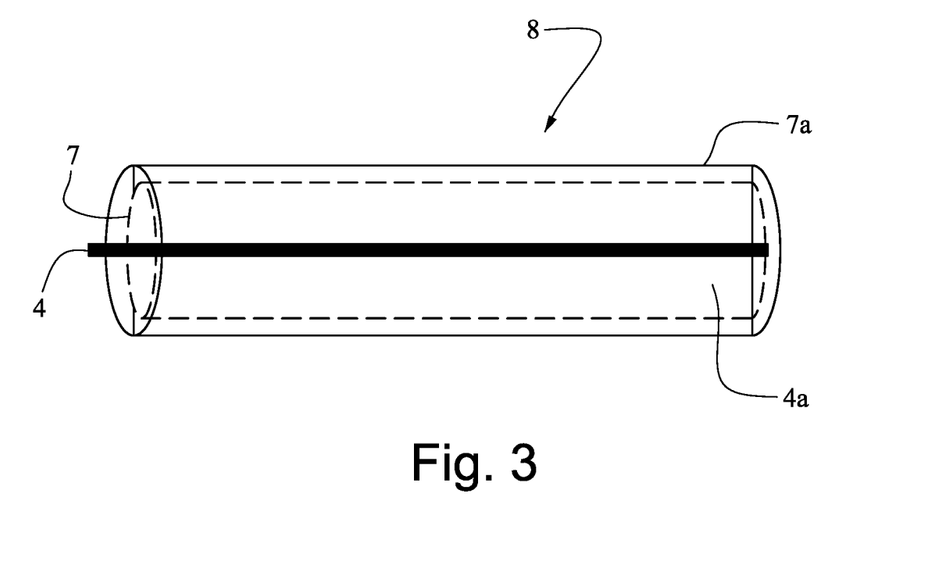
FIG. 3 shows a schematic view of a conductive sleeve arranged on an electrical link and forming part of the electrical protection device according to the invention.

With reference to FIGS. 2 and 3, the electrical link comprises a conductor 4 surrounded by an insulating cover 4a (for example a plastic sleeve) and the electrical protection device 3 comprises a part arranged on the insulating cover 4a of the electrical conductor 4, and a part formed of electronic devices that are for example arranged in a secure housing 12.

The part arranged on the insulating cover 4a comprises a conductive sleeve 7 surrounded by an insulating cover 7a. The conductive sleeve 7 surrounds the insulating cover 4a of the conductor 4.

The part situated in the housing 12 (see FIG. 2) comprises:

a circuit breaker 9 linked to the high-voltage power source 2 and that, when it is commanded in this respect, makes it possible to interrupt the supply of the signal HV to the user apparatus 5. In a known manner, the circuit breaker 9 operates as a switch that, when activated, opens and thus shuts off the conductor 4.

a current generator 10; and a detection module 11 for detecting a current leak out of the conductor 4.

A current leak occurs when the electrical link 8 is damaged. For example, a leak may result from contact of the conductor 4 with the conductive sleeve 7 when the insulating cover 4a is damaged or form contact of the conductor 4 with an element external to the electrical link when the two insulating covers 4a and 7a are damaged. A current leak may lead to the creation of electric arcs between the conductor and the conductive structure of the aircraft A or with another conductor set to a potential different from the conductor or with the current return line 6 if the latter is at a potential different from ground.

The electrical link 8 advantageously extends from the housing 12 and all the way to the user apparatus 5 (only a portion of the electrical link has been shown in FIG. 4).

As shown in FIG. 4, the current generator 10 provides the function of current-biasing the conductive sleeve 7 by injecting a direct current Ig on the conductive sleeve 7 at a current injection point 30 that is, for example, situated at the upstream end (housing 12 side) of the electrical link 8.

The current generator is preferably limited in terms of voltage, with a voltage limit chosen so as not to be hazardous to humans, typically less than 50 volts. This preferred option makes it possible to add an additional degree of protection for humans.

The sign of the bias current Ig is preferably the reverse of that of the voltage HV delivered by the high-voltage power source 2, in order to speed up the detection of a current leak by the detection module 11. For example, the bias current Ig delivered by the current generator 20 is −1 A for a voltage HV of 540 volts DC delivered by the high-voltage power source 2.

The detection module 11 (see FIG. 4) comprises a shunt 40 used to measure the current Ir tapped off at the tap-off point 31 of the conductive sleeve 7, a comparator 42 connected to the shunt 40, and a microcontroller 43 linking the output of the comparator to the input of the circuit breaker 9. The microcontroller thus receives an output signal of the comparator 42 and supplies a command signal to the circuit breaker 9.

The shunt 40, with a known resistance Rshunt, is connected at a first terminal to the current tap-off point 31 of the conductive sleeve 7, and at a second terminal to ground 50. The current tap-off point 31 is, for example, situated at the downstream end (on the user apparatus 5 side) of the electrical link 8.

The comparator 42 is connected, at a first input, to the first terminal of the shunt 40 via an electrical link termed detection line 51, and at a second input to a DC voltage generator 42a supplying a voltage, termed reference voltage, Vref.

The comparator 42 compares the voltage Ur in the detection line 51, which voltage is proportional to the current Ir measured via the shunt 40 (Ur=Ir×Rshunt), with the reference voltage Vref that is proportional to a reference current Iref (Vref satisfies Vref=Rshunt×Iref). The output signal of the comparator may adopt two states. The first state is indicative of a current leak out of the electrical link 8. The second state is indicative of an absence of a current leak out of the electrical link 8.

In the event of an absence of a current leak out of the conductor 4, Ir=Ig and Ur=Ig×Rshunt<Vref. Reference is then made to a voltage Ur in the detection line 51 that is nominal.

By way of example (see FIG. 4), in a scenario involving Boolean logic in which the first state of the output signal of the comparator 42 corresponds to the state 1 and the second state of the output signal corresponds to the state 0, and if the voltage HV is positive and the bias current Ig is negative, the negative input of the comparator is connected to the voltage generator 42a and the positive input is connected to the detection line 51 such that the output signal of the comparator changes to 1 when Ur becomes greater than Vref.

The microcontroller 43 is configured to monitor a change of state of the output signal of the comparator 42, so as to detect a current leak out of the electrical link 8. If the microcontroller detects a change of state of the output signal from the second state to the first state, it sends a command signal to the circuit breaker containing instructions to activate said circuit breaker so as to cut off the high-voltage supply HV to the user apparatus 5.

As an option, a low-pass filter (active, passive or hybrid) 41 is arranged between the comparator 42 and the shunt 40 so as to eliminate interference signals that may be present on the conductive sleeve 7 and that could falsify the results of the comparisons performed by the comparator 42.

Figure 5:
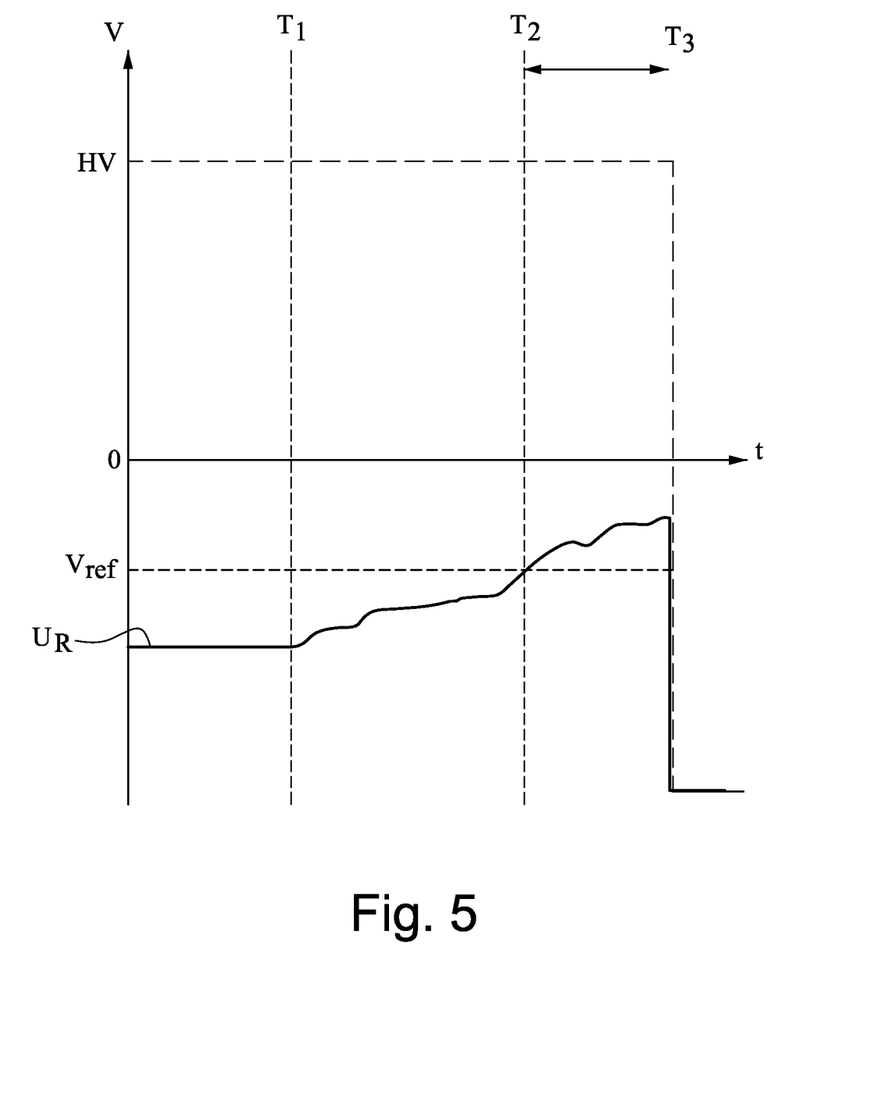
FIG. 5 is a diagram illustrating the evolution of the current measured at a tap-off point of a conductive sleeve according to FIG. 3 when the latter is current-biased.

With reference to FIG. 5, what is shown is an example of the evolution of the signals HV and Ur over time when, starting from a time T1, the electrical link 8 exhibits a fault (scenario of a fault with/breakage of the insulating cover 4a or of a fault with/breakage of the insulating covers 4a and 7a), and a situation occurs whereby current leaks out of the conductor 4.

In these examples, the high-voltage power source 2 produces a positive voltage HV, and Ir is negative, and:

HV=540 V,
Ig=−1 A,
Rshunt=10 ohms,
Vref=−5 V, i.e. a fault is detected as soon as the leakage current Ir reaches 0.5 A.

With consideration to these data, Ur nominal is equal to −10 V.

From a time 0 until the time T1, there is no current leak out of the electrical link 8, and the voltage Ur in the detection line 51 is constant and bounded by Vref as an upper bound.

At the time T1, the conductor 4 for example enters into contact with the conductive sleeve 7 (fault with the insulating cover 4a), and the voltage Ur in the detection line 51 increases until it exceeds the reference voltage Vref at the time T2. From this moment, the output signal of the comparator 42 changes from its second state to its first state, and the microcontroller 43 receiving the signal from the comparator 42 sends a command signal to the circuit breaker containing instructions to activate the circuit breaker. At the time T3, the circuit breaker 9 is activated and the supply of electric power is interrupted: the voltage HV becomes zero. The period between the times T2 and T3, of the order of a few milliseconds, corresponds to the reaction time of the electronic devices forming the detection module 11, and to the reaction time of the circuit breaker 9.

The electrical protection device 3 reacts as soon as a current leak is detected, to interrupt the supply of electric power after a brief reaction time of the electronic circuits. The current-biased conductive sleeve 7 thus forms a detector that is capable of detecting damage to the electrical link 8. The fast cutting off (a few milliseconds) of the electric power prevents damage to the surrounding materials through a thermal effect, and also prevents the injection of current into the surrounding materials and the propagation of the high voltage HV into other cables/conductors.

The characteristics of the shunt 40 are chosen such that the voltage Ur in the detection line 51, before T1 in FIG. 5, is lower than the voltage limit of the current generator 10 supplying Ig. Contact of the biased conductive sleeve 7 (when the electrical link 8 does not exhibit a fault) with a human is not hazardous, as the conductive sleeve 7 is not at an electrical potential that is hazardous to humans.

Figure 6:
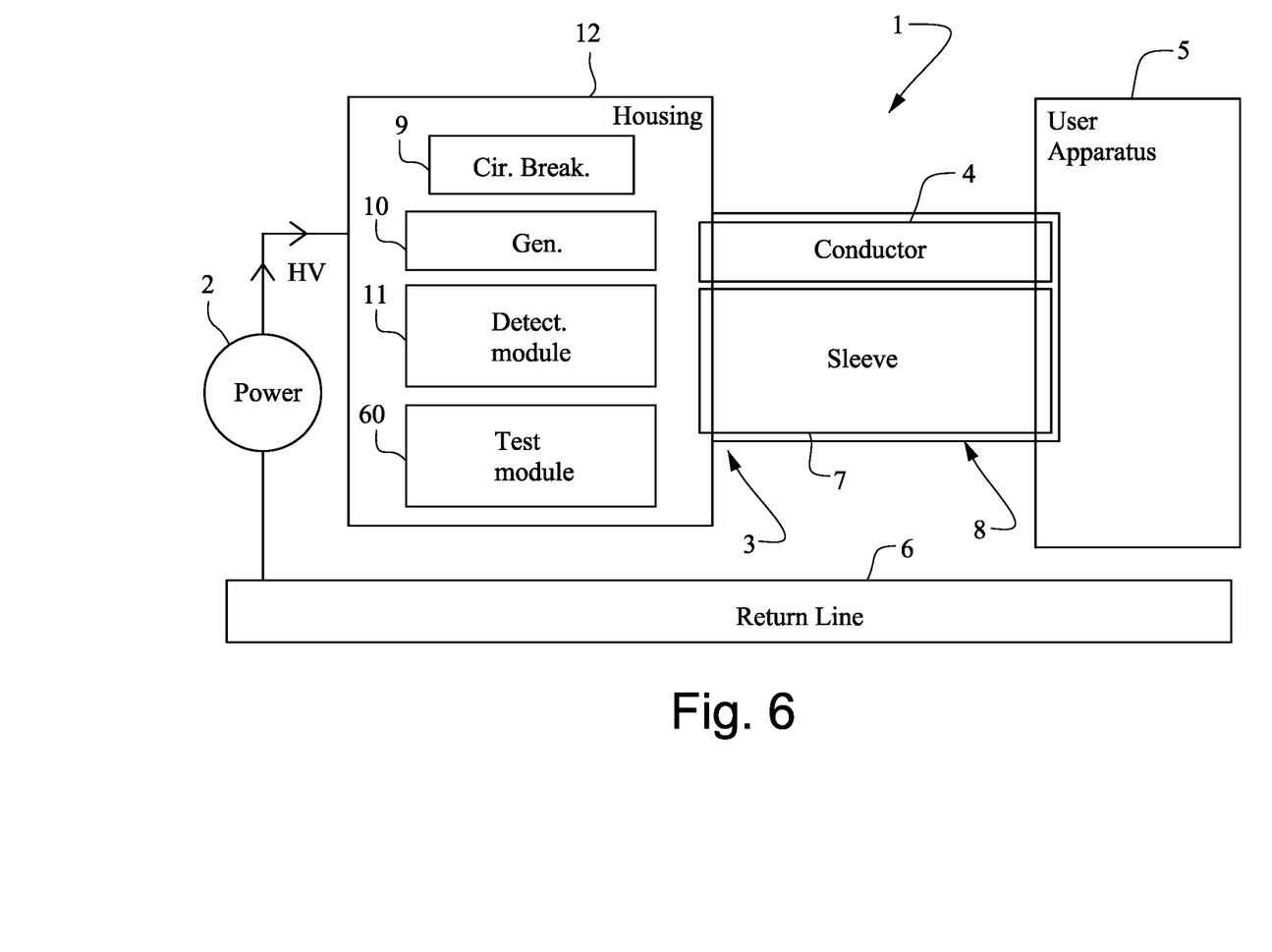
FIG. 6 is a view similar to FIG. 2, in which the device for the electrical protection of the conductor furthermore comprises a test module according to one embodiment of the invention.
Figure 7:
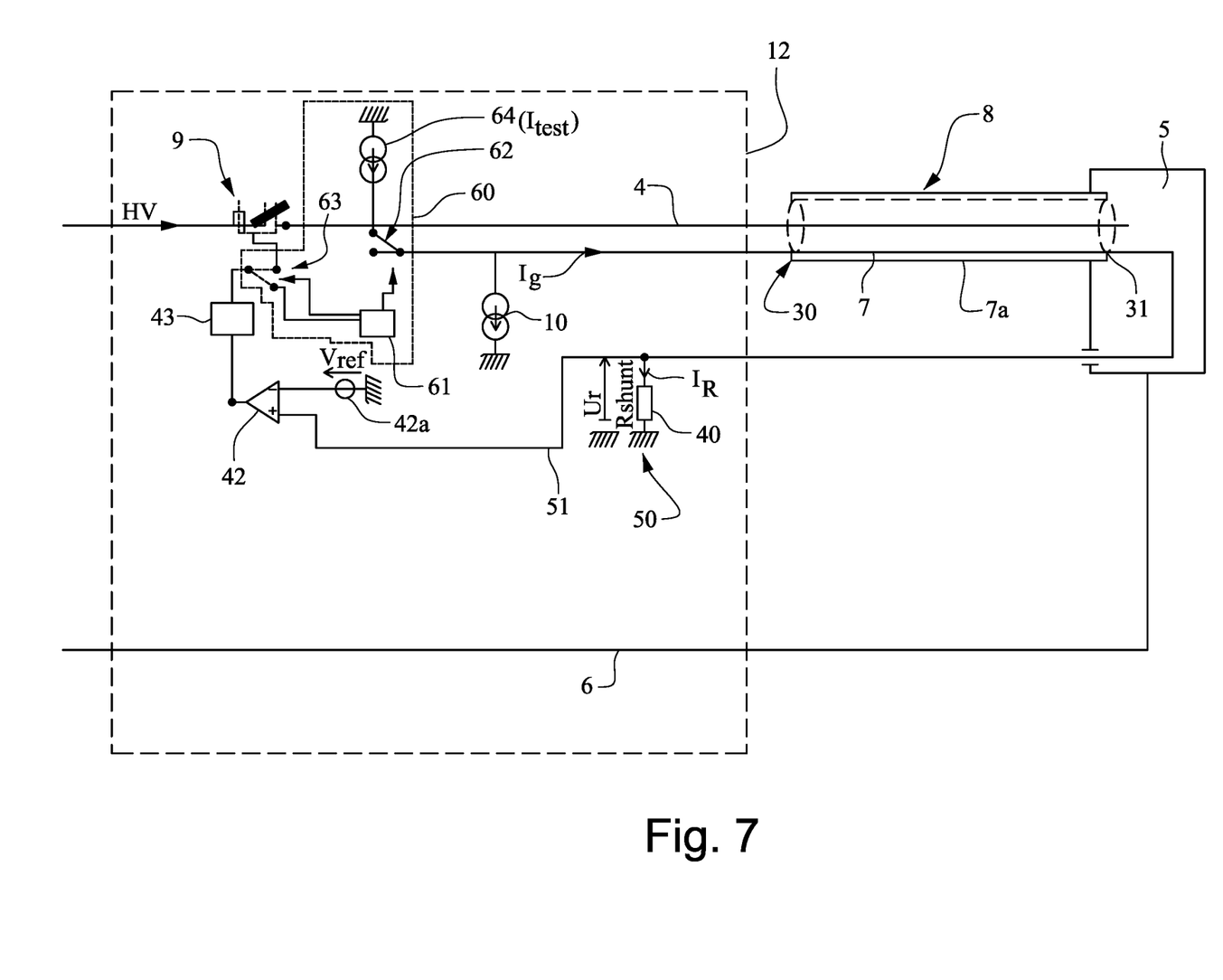
FIG. 7 shows a circuit diagram of the electrical installation shown in FIG. 6.

In a variant embodiment of the invention shown in FIGS. 6 and 7, the electrical protection device 3 furthermore comprises a test module 60 that makes it possible to check the correct operation of the detection module 11. The test module 60 consists of a central unit 61 associated with a first switch 62 and with a second switch 63. The central unit 61 commands the switching of the switches 62 and 63.

The first switch 62 is connected to the injection point 30 (either directly or indirectly). In the latter case, it is for example connected to the output of the current generator 10, and is able to switch to a first non-connected terminal or to a second terminal linked to a current generator 64 supplying a current, termed test current, Itest, having the same sign as the bias current Ig and chosen such that the value of the test current Itest plus the value of the bias current Ig leads to the output signal of the comparator 42 changing to its first state.

For example, picking up on the example given with reference to FIG. 5, Itest=0.55 A.

The second switch 63 is connected to the output of the microcontroller 43 and is able to switch to a first terminal linked to the central unit 61, such that only the latter receives the command signal from the microcontroller 43, or to a second terminal linked to the input of the circuit breaker 9, such that it is only the circuit breaker that receives the command signal from the microcontroller 43.

The second switch 63 is connected to the output of the microcontroller 43 of the detection module 11 and is able to switch to two different terminals:

a first terminal linked to the microcontroller 61 of the test module; or a second terminal linked to the input of the circuit breaker 9.

The central unit 61 is configured to control the switches 62, 63 and to implement a test step at regular intervals and for a predetermined duration.

When the test step is not implemented, the central unit 61 commands the switching of the first switch 62 to its first terminal and the switching of the second switch 63 to its second terminal.

When the central unit 61 implements the test step:

the first switch 62 switches to its second terminal so as to force the input of the detection module (the current injected into the sleeve is forced to exceed the high reference value Iref1) and the second switch 63 switches to its first terminal so as not to activate the circuit breaker 9 while the test is being implemented; and the central unit 61 receives the command signal from the microcontroller 43 and monitors a change of state of said signal from the second state to the first state, and is thus able to check whether the detection module 11 is operative, that is to say that it has indeed generated a signal containing instructions to activate the circuit breaker 9. If, at the end of a predetermined test time, the detection module 11 does not have the signal to activate the circuit breaker, the central unit 61 emits an alert intended for an operator, who is able to choose to maintain the supply of electric power until the end of the aircraft's flight, for example, or to bring about the interruption of the supply of electric power by actuating a manual circuit breaker (not shown) in the aircraft's cockpit, for example. An operator will have to repair the detection module 11 in order for the system for securing the supply of electric power to become operational again.

In the above description, current return line 6 is understood to mean either a return conductor or a current return network. If the current return line 6 is a conductor set to a voltage different from that of the conductive structure of the aircraft, then an electrical protection device such as described above will have to be associated with the current return line 6 in order to secure the current return.

In one variant that is not shown, in order for the conductive sleeve 7 and its insulating cover 7a to form electrical shielding (which also performs the role of shielding against lightning or electromagnetic pulses) for the electrical conductor 4 and its insulating cover 4a, a first limiting element is arranged between the current generator 10 and the injection point 30, and a second limiting element is arranged between the tap-off point 31 and the shunt 40. The two limiting elements are transient-voltage suppression diodes with a breakdown voltage greater than Vref in terms of absolute value.

The invention has been described for the purpose of protecting the transmission of electric power via an electrical link of an electrical installation 1 on an aircraft A. However, the invention is applicable to any other type of vehicle, for example a boat or an automobile.

The invention has been described, in particular through the example illustrated in FIG. 5, for a positive voltage HV and a negative bias current. It is within the scope of those skilled in the art to modify the invention so as to take account of other parameters (positive voltage HV, positive or negative bias current).

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An electrical link configured to link a DC high-voltage power source to a user apparatus, the electrical link comprising:
    an electrical conductor surrounded by an insulating cover, wherein the electrical conductor is connectable to the DC high-voltage source, and
    an electrical protection device comprising:
        a conductive sleeve arranged around the insulating cover,
        a current generator generating a direct current and connected to a current injection point of the conductive sleeve, wherein the direct current is applied as a biasing current to the conductive sleeve;
        a circuit breaker in series with the electrical conductor and configured to interrupt current through the conductor, and
        a detection module connected to a current tap-off point of the conductive sleeve and to the circuit breaker, and the detection module is configured to (i) detect current flowing through the conductive sleeve, (ii) compare the current flowing through conductive sleeve to a predetermined current level greater than the biasing current, and (iii) command the circuit breaker to interrupt the current in the conductor if the current flowing through the conductive sleeve is at least at the predetermined current level.

2. The electrical link according to claim 1, wherein the detection module comprises:
    a shunt having a first terminal connected to the tap-off point and a second terminal connected to a ground;
    a comparator including a first input connected to the first terminal of the shunt via a detection line, and a second input connected to a DC voltage generator supplying a reference voltage (Vref); and
    a microcontroller receiving output signals from the comparator and generating a command signal to cause the circuit breaker to interrupt the current to the conductor, wherein the microcontroller is configured to issue the command signal to the circuit breaker in response to a certain output signal received from the comparator.

3. The electrical link according to claim 2, further comprising a test module including a central unit connected to a first switch and a second switch, wherein the central unit is configured to command the switching of the first and second switches;
    wherein the first switch is connected to the injection point and is configured to switch between a first non-connected terminal and a second terminal linked to a current generator supplying a DC test current; and
    wherein the second switch is connected to the output of the microcontroller and is configured to switch between a third terminal linked to the central unit such that only the central unit receives the command signal from the microcontroller, and a fourth terminal linked to the circuit breaker such that only the circuit breaker receives the command signal from the microcontroller.

4. The electrical link according to claim 2, wherein the detection module comprises a low-pass filter in series with the detection line.

5. The electrical link according to claim 2, wherein an insulating cover surrounds the conductive sleeve.

6. The electrical link of claim 1, wherein the current generator is conductively connected to the conductive sleeve and is not conductively coupled to the electrical conductor.

7. The electrical link of claim 1, wherein the current generator applies a voltage level no greater than fifty volts to the conductive sleeve and the voltage source applies a voltage of at least 270 volts to the electrical conductor.

8. A method to provide a secure supply of electric power to a user apparatus in a vehicle via an electrical link connecting the user apparatus and a power source supplying a DC voltage to the electrical link, wherein the vehicle includes a conductive structure forming a ground and the electrical link includes:
    an electrical conductor surrounded by an insulating cover;
    an electrical protection device including a conductive sleeve arranged around the insulating cover;
    a current generator connected to a current injection point of the conductive sleeve;
    a circuit breaker in series with the electrical conductor and configured to interrupt current transiting in the electrical conductor; and
    a detection module comprising a shunt including a first terminal connected to a current tap-off point of the conductive sleeve and a second terminal connected to ground, a comparator including a first input connected to the first terminal of the shunt via a detection line and a second input connected to a DC voltage generator supplying a reference voltage (Vref), and a microcontroller connected between an output of the comparator and the circuit breaker,
    wherein the method comprises:
        injection by the current generator of a direct biasing current (Ig) at the current injection point;
        measurement of a magnitude of a current (Ir) via the shunt tapped off at the current tap-off point;

comparison, by the comparator, of a voltage (Ur) on the detection line and the reference voltage (Vref), wherein the voltage (Ur) is determined from the current (Ir) and the comparator generates of a first output signal indicative of the comparison if the current (Ir) is below a predetermined current level higher than the direct biasing current (Ig) and generates a second output signal if the current (Ir) is above the predetermined current level;

monitoring by the microcontroller of the output signal of the comparator and determining if the output signal is the first or second output signal; and activation, by the microcontroller, of the circuit breaker to interrupt the current in the electrical conductor in response to the output signal of the comparator being the second output signal.

9. The method according to claim 8, wherein the detection module includes a test module and the test module includes a central unit coupled to a first switch and a second switch;

wherein the central unit commands switching of the first and second switches;

wherein the first switch is connected to the current injection point and switches between a first non-connected terminal and a second terminal linked to a current generator supplying a DC test current, wherein a current of the DC test current and the direct current while applied to the comparator causes the comparator to output an output signal indicative of a current leak;

the second switch is connected to the output of the microcontroller and switches between a third terminal linked to the central unit such that only said central unit receives the command signal from the microcontroller and a fourth terminal linked to the circuit breaker such that only the circuit breaker receives the command signal from the microcontroller;

wherein the method further comprises a test step during which the central unit commands the first switch to switch to the second terminal and commands the second switch to switch to the third terminal and thereafter the central unit monitors a change of the command signal from the microcontroller; and in response to an end of the test step, the central unit commands the first switch to switch to the first terminal and commands the second switch to switch to fourth terminal.

10. An electrical link system comprising:

a conductor configured to connect to a DC voltage power source and to an electrically powered user apparatus;

an insulating cover surrounding the conductor;

a conductive sleeve around the insulating cover;

a current generator generating a direct current and connected to a current injection point of the conductive sleeve, wherein the current generator applies a the direct current to the conductive sleeve;

a circuit breaker in series with the conductor and configured to interrupt current through the conductor;

a shunt resistor having a first terminal connected to a tap-off point of the conductive sleeve and a second terminal connected to a ground;

a comparator including a first input connected to the first terminal of the shunt resistor and a second input connected to a reference voltage, wherein the comparator generates an output signal indicative of a difference between the voltage applied to the first terminal and the reference voltage applied to the second terminal;

a controller receiving the output signal from the comparator and, based on the output signal, determines whether to command the circuit breaker to interrupt the current in the conductor;

a central switch unit connected to a first switch and a second switch, wherein the central switch unit is configured to command the switching of the first and second switches;

the first switch is connected to the injection point and is configured to switch between a first non-connected terminal and a second terminal receiving a DC test current; and the second switch is connected to an output of the controller and is configured to switch between a third terminal linked to the central unit such that only the central unit receives commands from the controller, and a fourth terminal linked to the circuit breaker such that only the circuit breaker receives commands from the controller, wherein the central switch switches the second switch to the third terminal in response to the first switch being at the first non-connected and switches the second switch to the fourth terminal in response to the first switch being at the third terminal.

11. The electrical link system according to claim 10, further comprising a low-pass filter in series between the first terminal of the shunt resistor and the first input of the comparator.

12. The electrical link system according to claim 10, further comprising an insulating cover surrounding the conductive sleeve.

\* \* \* \* \*